United States Patent [19]

Folmsbee et al.

[11] 4,358,833
[45] Nov. 9, 1982

[54] MEMORY REDUNDANCY APPARATUS FOR SINGLE CHIP MEMORIES

[75] Inventors: Alan C. Folmsbee, Santa Clara; Kim Kokkonen, Campbell; William J. Spaw, Moss Beach, all of Calif.

[73] Assignee: Intel Corporation, Santa Clara, Calif.

[21] Appl. No.: 192,494

[22] Filed: Sep. 30, 1980

[51] Int. Cl.³ .............................................. G11C 7/00
[52] U.S. Cl. ........................................ 365/200; 371/10
[58] Field of Search ............................ 365/200; 371/10

[56] References Cited

U.S. PATENT DOCUMENTS 4,051,354  9/1977  Choate ............................... 365/200
4,281,398  7/1981  McKenny et al. ................. 365/200

Primary Examiner—George G. Stellar
Attorney, Agent, or Firm—Blakely, Sokoloff, Taylor & Zafman

[57] ABSTRACT

An improved addressing means for single chip memories which include a plurality of redundant lines and associated cells is described. Y address signals are used during programming to select and program redundant X decoders. The redundancy apparatus is implemented without any additional package pins and programming may be performed after packaging. The apparatus includes means for permanently disabling all further programming of the redundancy circuitry to prevent inadvertent programming by a user.

11 Claims, 4 Drawing Figures

4,358,833

MEMORY REDUNDANCY APPARATUS FOR SINGLE CHIP MEMORIES

BACKGROUND OF THE INVENTION

1. Field of the Invention

The invention relates to the field of redundant circuits, particularly for use in single chip memories.

2. Prior Art

It is well known to use redundant memory circuits, on a systems level to increase reliability, and on a chip-level, to improve production yields. See U.S. Pat. No. 4,047,163 and "Circuit Implementation of Fusible Redundant Addresses on RAMs For Productivity Enhancement, " *IBM J. Res. Develop.* Volume 24 No. 3, May 1980 by Fitzgerald and Thoma for discussions concerning chip level redundancy.

In some memories with redundant cells, faulty cells are first identified during probe testing of the wafer and then fuses are blown to allow selection of the redundant cells. In some cases, particularly on dynamic RAMs and EPROMs, it is preferable to select redundant cells after the chip has been packaged since often faulty cells are first detected after the chip has been packaged. As will be seen, the present invention provides a redundancy apparatus which permits selection of redundant cells after the chip has been packaged. Importantly, no extra package pins are required in the programming operation which provides for the permanent selection of the redundant cells to replace the defective cells.

One problem area which arises where redundancy programming is possible at the package level, is that the user may inadvertently program the circuits. Such inadvertent programming could cause a user, for example, to permanently select a faulty redundant line, or cause other problems. The present invention provides a mechanism for permanently disabling the programming circuitry, thus preventing a user from inadvertently programming or reprogramming.

SUMMARY OF THE INVENTION

The improved redundancy apparatus of the present invention is particularly useful in memories where first address signals are used to select first lines in an array such as row lines, and second address signals are used to select second lines, such as bit lines. The improvement includes a plurality of redundant row lines. Programmable decoding means are included for selecting the redundant row lines upon receipt by the memory of predetermined row address signals. These row address signals correspond to the addresses of the faulty row lines. The apparatus includes selection means which receives the address signals for the second lines (e.g., bit lines). This selection means selects the programmable decoding means during the programming operation, and includes a mechanism for preventing further programming. In this manner, once the faulty lines in the arrray have been replaced with redundant lines, further inadvertant programming is permanently inhibited.

When a redundant row is selected, all non-relevant rows are deselected.

The apparatus can be used for redundant rows as described above, or for redundant columns by selecting the programmable decoding means with the row addresses.

DETAILED DESCRIPTION OF THE INVENTION

A redundancy apparatus which permits the selection of redundant lines (and associated cells) in an MOS memory is disclosed. In the following description, numerous specific details, such as specific address arrangements, etc., are set forth in order to provide a thorough understanding of the present invention. However, it will be obvious to one skilled in the art that these specific details are not required to practice the present invention. In other instances, well known circuits are shown in block diagram form in order not to obscure the present invention in unnecessary detail.

Figure 1:
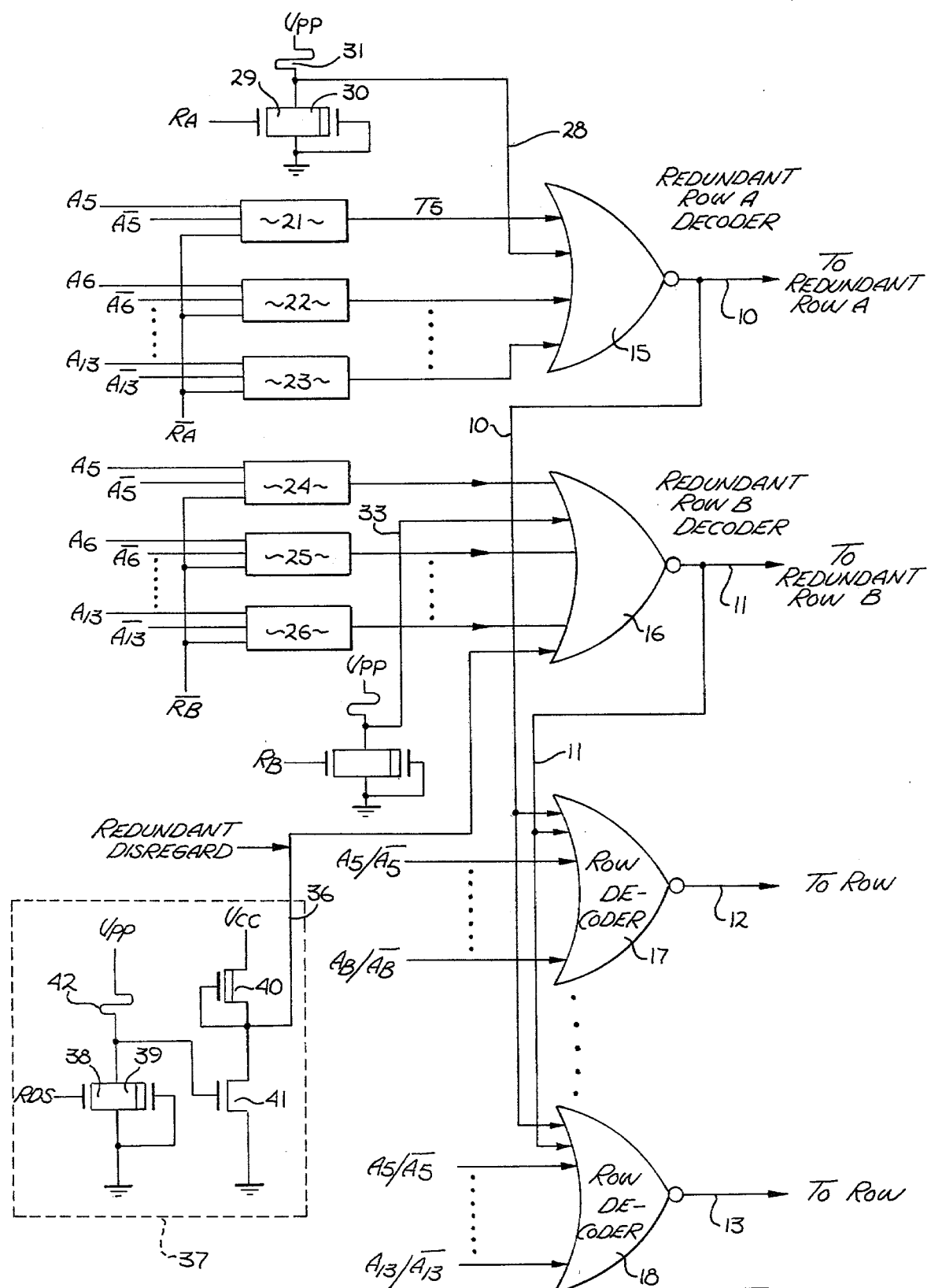
FIG. 1 is a block diagram showing the general layout of the redundant row decoders and their coupling to the normal row decoders and other circuitry associated with the redundancy apparatus of the present invention.
Figure 2:
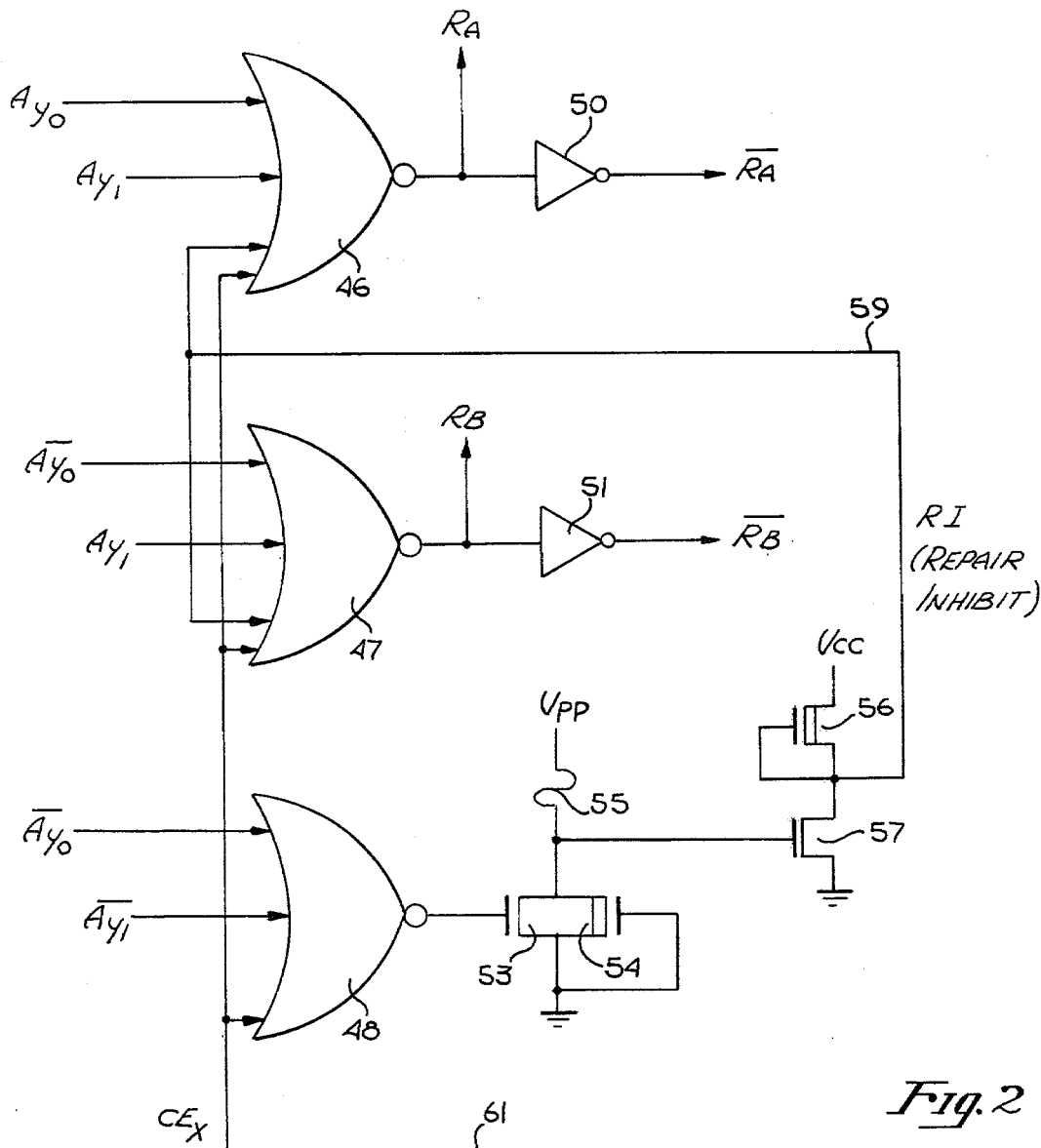
FIG. 2 is an electrical schematic of the circuitry used to select a particular programmable decoder for programming.
Figure 2:
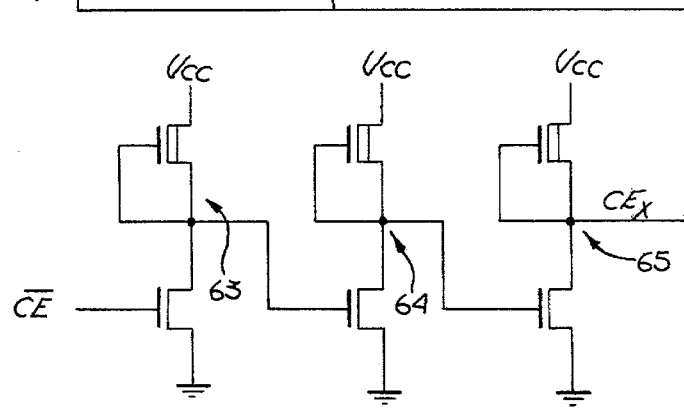
Figure 3:
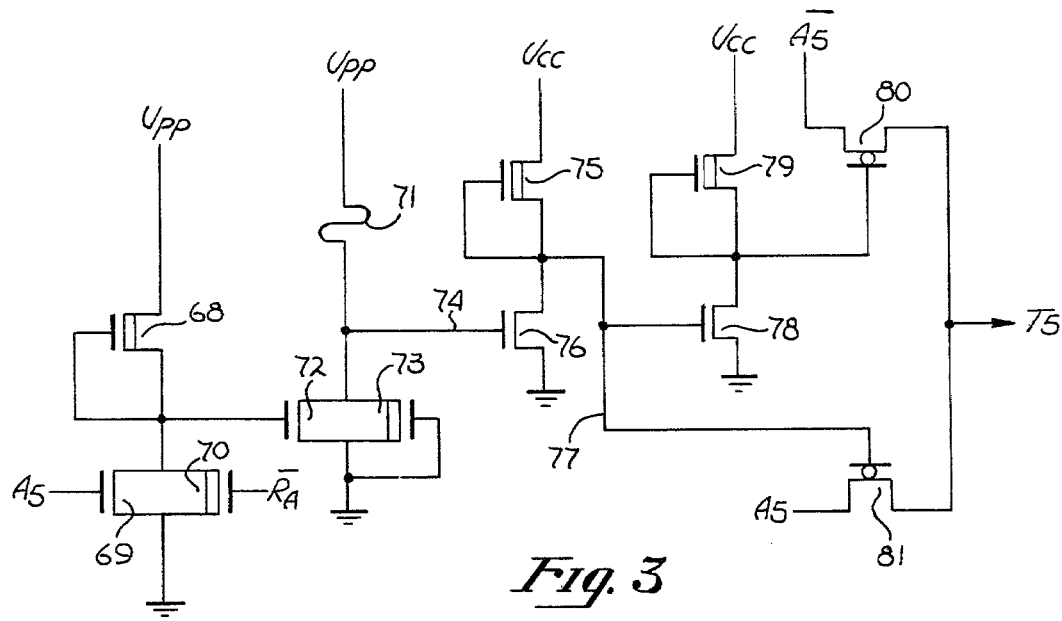
FIG. 3 is an electrical schematic of a programmable buffer used in the present invention.

The redundancy apparatus of the present invention may be used with random-access memories (RAMs), electrically programmable read-only memory (EPROMs), and other memories. The circuitry shown in FIGS. 1 through 3 is directed to an EPROM and particularly, an EPROM employing floating gate memory devices. Such EPROMs use a potential of approximately 20 volts ($V_{pp}$) for the programming of the memory cells. This higher potential is also used to blow fuses during the programming of the redundancy circuitry of the present invention. During non-memory programming operation of these memories, $V_{pp}$ is held at the $V_{cc}$ potential (approximately 5 volts for the n-channel field-effect transistors employed in the presently preferred embodiment). For RAMs and other memories which do not have the $V_{pp}$ potential, during the programming of the fuses, $V_{cc}$ is raised as high as possible (without damaging any of the devices of the memory), for example, to 9 volts for n-channel MOS devices. This is sufficient potential to blow the fuses.

In the presently preferred embodiment, the redundancy circuit includes a plurality of polysilicon fuses which are selectively blown (opened) to provide programming. These fuses have a resistance of approximately 150 ohms and require 30 ma to blow. Approximately 9 volts is sufficient for a period of 10 msec to blow a fuse. These fuses are described in U.S. Pat. No. 3,792,319 entitled "Polycrystalline Silicon Fusible Links For Programming Read-Only Memories."

For purposes of explanation, it is assumed for FIG. 1 that the memory includes two redundant (extra) row lines. The row lines include memory cells which are used to replace faulty cells within the memory array. Redundant row A is selected by an ordinary decoder which is shown as a NOR gate 15. The output of this NOR gate (line 10) selects the redundant row A. Similarly, for the redundant row B, decoder 16 selects the redundant row B (line 11). The "normal" row decoders (which select rows in the array) may be identical to the decoders 15 and 16, and two such decoders 17 and 18 which select rows 12 and 13, respectively, are also shown in FIG. 1. The decoders 17 and 18 and all the normal other row decoders each receive a different combination of the row address signals and their complements (shown as $A_5$ through $A_{13}$ and their complements). The normal row decoders 17 and 18 also receive as an input, an output signal from the redundant row decoders 15 and 16. Thus, line 10 is coupled to the input of the decoders 17 and 18, and likewise, line 11 is coupled to the input of the decoders 17 and 18. If redundant row A or B is selected, all the normal rows in the array are deselected. This prevents the selection of a faulty normal row when the address for that row is applied to the memory. Each of the redundant row decoders receives input signals from programmable buffers, such as buffers 21 through 26. (Buffer 21 is shown in detail in FIG. 3.) Each of these identical buffers for each redundant row decoder receives a different row address signal and its complement. For example, buffer 21 receives $A_5$ and $\overline{A_5}$, buffers 22, $A_6$ and $\overline{A_6}$, etc., and similarly, buffer 24 for the decoder 16 receives the signals $A_5$ and $\overline{A_5}$, and so on. The buffers associated with the decoder 15 also receive a signal $\overline{R_A}$, and the decoders associated with decoder 16 receive a signal $\overline{R_B}$. These signals allow the selection of the buffers associated with a single decoder for programming purposes. The generation of these signals shall be discussed in conjunction with FIG. 2.

When a faulty row is identified in the array, the buffers 21 through 23 (or buffers 24 through 26) are programmed so as to recognize the address of the faulty row, and upon receipt of this address provide all low signals to the decoder 15. This, in turn, (provided the signal on line 28 is low) provides a high output on line 10 selecting row A in lieu of the faulty row. Each faulty row in the array is replaced with a redundant row, provided there are a sufficient number of redundant rows.

If there are no faulty rows, or if there are more redundant rows than faulty rows, it is necessary to prevent the selection of unused, redundant rows. Assume, for example, that there are no faulty rows in the array, and therefore, row A is not to be selected by any address. The signal on line 28 which is coupled to the decoder 15 prevents the selection of the row A. Line 28 is coupled to $V_{pp}$ through fuse 31, and to ground through the parallel combination of the enhancement mode transistor 29 and a depletion mode transistor 30. The transistor 29 is relatively large, and when it conducts, it draws sufficient current from $V_{pp}$ to blow the fuse 31. The transistor 30 is relatively small when compared to transistor 29 and assures that line 28 remains at ground potential when the fuse 31 is blown. The gate of transistor 29 is coupled the $R_A$ signal. This signal is brought high during the programming of the buffers associated with the decoder 15, namely, buffers 21 through 23. If these buffers are not programmed (meaning row A is not to be used), transistor 29 never conducts. The fuse 31 then remains intact, and a positive potential is always coupled to line 28. The positive potential on line 28 prevents a high output from the redundant decoder 15.

On the other hand, if the redundant row A is to be used, the buffers 21 through 23 are selected for programming. When the $R_A$ signal is high, fuse 31 is blown and line 28 is thereafter coupled to ground through transistor 30. The low signal on line 28 assures that decoder 15 may be selected when the appropriate address is applied to the buffers 21 through 23.

The decoder 16 is coupled to receive a similar signal on line 33. Line 33 is coupled to $V_{pp}$ through a fuse, which fuse is blown when $R_B$ is high. Similarly, the programmable circuitry associated with each redundant row line includes a circuit receiving an "R" signal.

It may be found that after the selection of a redundant row, the redundant row includes a faulty cel, and thus, should be discarded. While not used in the presently preferred embodiment, a circuit such as shown within dotted line 37 of FIG. 1 may be coupled to each of the redundant row decoders, to allow deselection of a selected redundant row. A "redundant disregard" signal, on line 36 provides permanent de-selection of the decoder 16. The RDS signal which controls MOS device 38 is generated from the second address signals and the $\overline{CE}$ signal, in a manner similar to the generation of the $R_A$ signal described below.

Line 36 is coupled to an inverter comprising transistors 40 and 41. The gate of transistor 41 is coupled to $V_{pp}$ through fuse 42. This fuse is coupled to ground through the parallel combination of transistors 38 and 39. If the fuse 42 remains intact, transistor 41 will conduct and line 36 will be kept at ground potential. This will allow the decoder 16 to operate normally. On the other hand, if the row B has been selected and found to be faulty, a signal (RDS) will be applied to the gate of transistor 38, thereby blowing fuse 42. This will keep line 36 permanently high since transistor 41 will not conduct. (Line 36 is clamped to $V_{cc}$ through transistors 40.) This, in turn, will prevent the selection of the redundant row line and allow another redundant row line to be selected to replace a faulty row line.

In the present invention, for purposes of programming the redundancy circuitry, the Y-line addresses (e.g, bit line addresses) are used for selecting groups of programmable buffers. This permits selection with no extra package pins. The number of The Y-line address bits required for programming is a function of the number of redundant lines in the memory. If, for example, the memory includes four redundant lines, two Y-address bits are necessary to select each group of buffers for programming. However, in the presently preferred embodiment, one additional Y-address bit is used to provide a distinct programming address for the permanent disabling (repair inhibit) of the programming circuitry for the redundant rows.

For the described example where two redundant rows are shown, two address signals are required, shown in FIG. 2 as $A_{y0}$ and $A_{y1}$ (and their complements). A different combination of each of these address signals is coupled to each of the NOR gates 46, 47 and 48 so as to enable individual selection of each of these gates by a different combination of these two Y-address signals. For example, when $A_{y0}$ and $A_{y1}$ are low, gate 46 may be selected. The gates 46, 47 and 48 also receive as an input, the $CE_x$ signal (line 61). The gates 46 and 47 additionally receive as an input RI.

The $\overline{CE}$ signal (chip enable) in addition to its normal function, is also coupled to the inverter 63. The output of the inverter 63 is coupled to the inverter 64, and the output of the inverter 64 is coupled to the inverter 65. The output of the inverter 65, (line 61) provides the $CE_x$ signal. The inverter 63 is a low ratio inverter, that is, the depletion mode transistor has a large width-to-length channel ratio, while the enhancement mode transistor has a small width-to-length channel ratio. In order to have a low output from the inverter 63, $\overline{CE}$ must be brought higher than its normal potential of 5 volts.

Thus, to initiate the programming of the redundancy circuitry, the $\overline{CE}$ signal is brought above 5 volts (e.g., 9 V). This causes a low output from inverter 63, a high output from inverter 64 and a low output from inverter 65. With the $CE_x$ signal low, the outputs of the gates 46, 47 and 48 may be brought high if the other inputs to these gates are low. During normal operation of the memory, $CE_x$ is high preventing programming. However, as will be discussed, other means are used to assure that programming does not inadvertently occur even if $\overline{CE}$ is brought above 5 volts.

Initially during the programming process the output of gate 48 is maintained low. This prevents transistor 53 from conducting and couples the gate of transistor 57 to $V_{pp}$ through the fuse 55. Line 59 is thus clamped to ground potential providing a low input to gates 46 and 47. Then, with the appropriate Y-address, gate 46 may be selected; the $\overline{R_A}$ signal is brought high and through inverter 50 the $R_A$ signal is brought low. Referring briefly to FIG. 1, with $R_A$ high and $\overline{R_A}$ low, the buffers 21 through 23 may now be programmed (as will be described) and fuse 31 is blown.

Next, with $\overline{A_{Y0}}$ low and $A_{Y1}$ low gate 47 is enabled such that $\overline{R_B}$ is high and through inverter 51 $R_B$ is low. This enables the programming of the programmable buffers 24 through 26 of FIG. 1.

After the programmable buffers have been programmed, the $\overline{A_{Y0}}$ and $\overline{A_{Y1}}$ signals are brought low causing the output of gate 48 to rise. Transistor 53 then conducts blowing fuse 55. This clamps the gate of transistor 57 to ground through transistor 54 and causes the repair inhibit signal to be clamped to $V_{cc}$ through transistor 56. Once this occurs, a high output can never again occur from gates 46 and 47 and thus, none of the programmable buffers can again be programmed. This prevents a user from inadvertently programming the buffers even if the $\overline{CE}$ signal is raised in potential. Care, of course, must be taken, in the sequencing of the programming operation to assure that a high output does not occur from the gate 48 until all the desired programming has been completed.

Referring now to FIG. 3, a typical programmable buffer such as the buffer 21 of FIG. 1 is shown. This buffer receives the $A_5$ signal on the gate of transistor 69 and on the drain terminal of transistor 81. The $\overline{RA}$ signal is applied to the gate of transistor 70. Transistors 69 and 70 couple to the gate of transistor 72 and to ground. This gate is also coupled to $V_{pp}$ (or $V_{cc}$) through the depletion mode transistor 68. It is apparent that during the programming of the buffer of FIG. 3, if $\overline{RA}$ is low (that is the buffer has been selected for programming) and if $A_5$ is low, fuse 71 will be blown since transistor 72 conducts. In that event, transistor 73 will clamp node 74 to ground potential.

If node 74 is at ground potential, the inverter comprising transistors 75 and 76 will provide a high output on line 77 which is coupled to the gate of the zero threshold device 81. This potential is also coupled to the inverter comprising transistors 78 and 79. This high potential couples the gate of transistor 80 to ground. Thus, transistor 80 is not conducting, while transistor 81 conducts with the fuse blown. During operation of the memory, if $A_5$ is high, $T_5$ will be high. On the other hand, if $\overline{A_5}$ is high, $T_5$ will be low, thus, $T_5$ is low only when $\overline{A_5}$ is low.

If during the programming, $A_5$ is high, transistor 69 conducts preventing transistor 72 from conducting. After the programming, node 74 is kept permanently high through the fuse 71. This causes transistor 76 to always conduct and clamps line 77 low. The output of the next inverter stage is high, causing transistor 80 to conduct. With transistor 80 conducting, $T_5$ follows the $\overline{A_5}$ signal.

Figure 4:
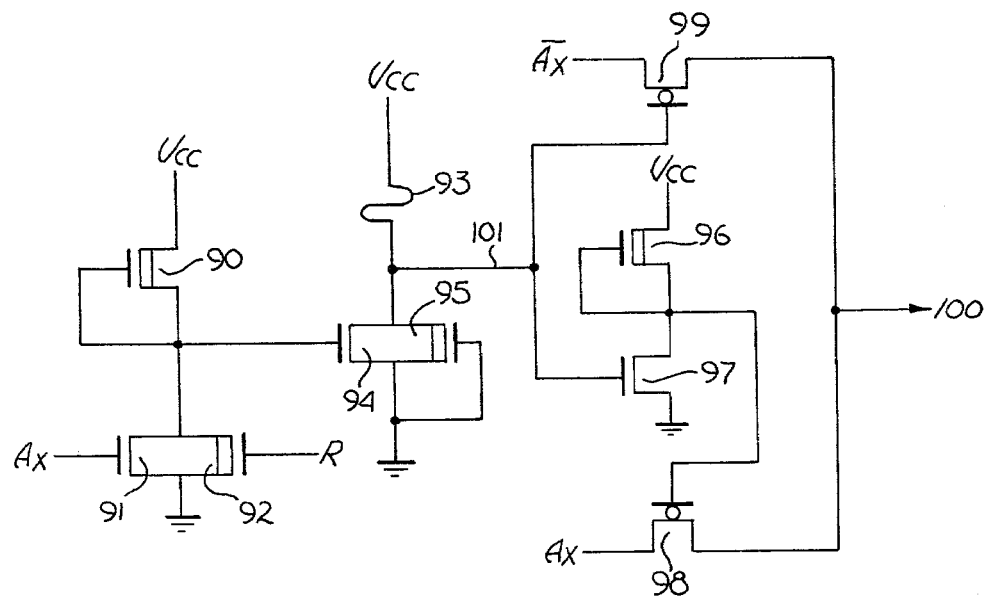
FIG. 4 is an electrical schematic of an alternate embodiment of the buffer of FIG. 3.

In some memories, particularly in RAMs, $V_{pp}$ is not used. In these cases, one less stage of inversion is used for the programmable buffer. Referring now to FIG. 4, transistor 91 again receives the "A" address signal and transistor 92 the "R" signal. The gate of transistor 94 is again pulled high through transistor 91 if neither transistor 90 nor 92 conducts. This blows the fuse 93 in an identical manner to the fuse 71 of FIG. 3. Again referring to FIG. 4, if the fuse 93 is blown, node 101 is pulled to ground through transistor 95. With node 101 low, transistor 99 does not conduct and transistor 96 pulls the gate of transistor 98 high, causing the line 100 to follow $A_x$. On the other hand, if the fuse is intact, node 101 is high causing transistor 99 to conduct. The high potential on node 101 causes transistor 97 to conduct pulling the gate of transistor 98 to ground, thereby preventing it from conducting. Line 101 then follows $\overline{A_x}$.

Assume that a faulty row in the array has been found or faulty cells along a row have been found and that the address for the row is $A_5$ through $A_{13}$ all binary ones. Further assume that redundant row A is to be programmed to replace the faulty row. $A_{Y0}$ and $A_{Y1}$ are brought low to bring $R_A$ high blowing fuse 31 and allowing programming of the buffers 21 through 23. All the programmable buffers 21 through 23 (and the others for the addresses $A_7$ through $A_{12}$) are programmed such that their outputs are low when $A_5$ through $A_{13}$ are high. In the case of the buffer of FIG. 3, this requires that the $T_5$ signal follow $\overline{A_5}$, that is transistor 80 must conduct. To have transistor 80 conducting as previously explained, the fuse must remain intact. This further means that during programming $A_5$ through $A_{13}$ remain high so that the fuses in the buffer are not blown.

During programming for each redundant decoder all the address lines $A_5$ through $A_{13}$ are first kept high to prevent any fuses from blowing. Then the signals are lowered one at a time when needed in order that only a single fuse is blown at one time. This prevents damaging the circuitry on the chip with excessive current. Put more simply, the row addressed are changed from all logical ones to the address of the defective row, one address bit at a time.

For each redundant row line which is to be used, the correct Y-address is applied to allow the programming of the buffer associated with that row line. Then, with the correct Y-address, the repair inhibit fuse 55 is blown preventing any additional programming.

Thus, a redundancy apparatus for a single chip memory has been described. No additional pins are required to program the redundancy circuitry and such programming may take place once the chip has been packaged. Once programming has been completed, the programming circuit is disabled, preventing inadvertent programming.

We claim:

1. In a memory which includes first lines selected by first address signals and second lines selected by second address signals, an improved redundancy apparatus comprising:
   a plurality of redundant first lines;
   programmable decoder means for selecting said redundant first lines upon receipt of predetermined ones of said first address signals, said selection means being programmed to recognize said predetermined first address signals;

selection means coupled to receive at least a portion of said second address signals for selection of said programmable means during said programming and for disabling programming of said decoder means upon receipt of certain signals;

whereby said memory is programmed to use said redundant lines, and then programmed to prevent inadvertent programming.

2. The apparatus defined by claim 1 wherein said selection means blows a fuse upon said receipt of said certain signals.

3. The apparatus defined by claim 2 wherein said certain signal is a predetermined second address.

4. The apparatus defined by claim 3 wherein said decoder means includes polysilicon fuses which are selectively blown.

5. The apparatus defined by claim 4 wherein said blowing or leaving intact said polysilicon fuses in said decoder means enables the selection of either a true one of said first address signals or the complement of said one of said first address signals.

6. The apparatus defined by claim 5 including means for deselecting a faulty one of said redundant lines.

7. In a memory which includes a plurality of array decoders coupled to receive first address signals and a plurality of array lines selected by said array decoders, an improved redundancy apparatus comprising:

a plurality of redundant lines;

a plurality of redundant decoders for selecting said redundant lines, said redundant decoders coupled to said array decoders so as to prevent selection of said array lines upon selection of one of said redundant lines;

programmable gating means coupled to receive said first address signals, for programming to provide predetermined first address signals to said redundant decoders;

selection means coupled to receive second address signals for selecting said gating means during said programming of said gating means; and repair inhibit means for preventing said programming of said gating means, said repair inhibit means coupled to receive said second address signals and being activated by predetermined second address signals;

whereby said memory may be programmed to replace faulty lines with said redundant lines and then inhibited from inadvertent programming.

8. The apparatus defined by claim 7 wherein said gating means includes polysilicon fuses which are selectively blown.

9. The apparatus defined by claim 8 wherein said blowing of said polysilicon fuses controls selection of true and complement ones of said first address signals.

10. The apparatus defined by claim 7 wherein said repair inhibit means includes a polysilicon fuse which is blown for said preventing of said programming.

11. The apparatus defined by claim 7 including means for deselecting a faulty one of said redundant lines.

* * * * *